(12) United States Patent
Lawrence et al.

(10) Patent No.: US 6,362,639 B2
(45) Date of Patent: Mar. 26, 2002

(54) COMPLIANT CONTACTOR FOR TESTING SEMICONDUCTORS

(75) Inventors: Justin L. Lawrence; Steven L. Hamren, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/877,950

(22) Filed: Jun. 8, 2001

Related U.S. Application Data

(63) Continuation of application No. 09/330,331, filed on Jun. 11, 1999, now Pat. No. 6,259,263.

(51) Int. Cl.⁷ ........................ G01R 31/02; H01R 13/00
(52) U.S. Cl. .................... 324/758; 324/158.1; 324/754; 324/761; 324/763
(58) Field of Search ............................... 324/758, 754, 324/761, 763, 765, 158.1; 439/71

(56) References Cited

U.S. PATENT DOCUMENTS

| | | | |
|---|---|---|---|
| 4,636,723 A | 1/1987 | Coffin | 324/763 |
| 4,782,289 A | 11/1988 | Schwar et al. | 324/754 |
| 4,829,241 A | 5/1989 | Maelzer | 324/754 |
| 5,001,422 A | 3/1991 | Dahlberg et al. | 324/763 |
| 5,245,277 A | 9/1993 | Nguyen | 324/763 |
| 5,247,250 A * | 9/1993 | Rios | 324/754 |
| 5,384,531 A | 1/1995 | Yamazaki et al. | 324/765 |
| 5,389,885 A | 2/1995 | Swart | 324/761 |
| 5,440,231 A | 8/1995 | Sugai | 324/158.1 |
| 5,456,613 A * | 10/1995 | McHugh | 439/268 |
| 5,485,096 A | 1/1996 | Aksu | 324/761 |
| 5,647,756 A | 7/1997 | Twigg et al. | 439/331 |
| 5,656,943 A | 8/1997 | Montoya et al. | 324/754 |
| 5,788,526 A | 8/1998 | Twigg et al. | 439/331 |
| 6,033,235 A | 3/2000 | Ikeya | 439/71 |

* cited by examiner

Primary Examiner—Glenn W. Brown
Assistant Examiner—Wasseem H. Hamdan
(74) Attorney, Agent, or Firm—Knobbe, Martens, Olson & Bear, LLP

(57) ABSTRACT

A compliant contactor interfaces a semiconductor device under test with a tester. The compliant contactor accepts a variety of different sized semiconductor devices along with a variety of different pinouts of the semiconductor devices. The compliant contactor includes an upper alignment block and a lower alignment block which receives the contact pins of the tester. The upper alignment block may move within a predefined distance with respect to the lower alignment block to account for any tester movement, thermal expansion or contraction, or other factors. In an alternative embodiment, the compliant contactor may move in three directions with respect to the test board. In this embodiment, a contact pad provides electrical connection between a daughter card and the test board. The contact pad may be a compressible elastomeric connector.

11 Claims, 7 Drawing Sheets

COMPLIANT CONTACTOR FOR TESTING SEMICONDUCTORS

RELATED APPLICATION

This application is a continuation of U.S. patent application Ser. No. 09/330,331, U.S. Pat. No. 6,259,263 B1 issued on Jul. 19, 2001, filed on Jun. 11, 1999, which is incorporated by reference herein.

BACKGROUND OF THE INVENTION

1. Field of the Invention

This invention relates to the field of testers for integrated circuits. More specifically, the invention relates to a device to hold and align an integrated circuit within a tester.

2. Description of the Related Art

A chip is the smallest unit of fabrication in semiconductor technologies. A single chip normally contains multiple transistors that are connected into more useful entities known as logic gates. Complex chips have many logic gates, forming multiple logic circuits. Very Large Scale Integrated (VLSI) circuit chips, a class of chips with very dense circuitry, can host millions of transistors per chip, and can embody a number of computational devices on a single chip, including memories and microprocessors.

As presently fabricated, a chip is a thin (0.2 to 0.25 mm) piece of square or rectangular silicon encapsulated in an outer package. This package (for example, a dual inline package (DIP), a ball grid array package, a leadless carrier, or the like) provides pins that electrically connect the chip to its operating environment, normally a printed circuit board. The silicon chips are generally first fabricated as a matrix of dozens or even hundreds of dies that are etched on a large slice of silicon, termed a wafer. After fabrication, the wafer is diced and the individual dies are packaged into chips. Each die, while still on the wafer, includes electrical contacts that allow electrical signals to be input and output from the die circuitry.

VLSI chips must be tested both during the prototype stages of development and thereafter during mass production, to first verify the integrity of their design, and then to verify the quality of their manufacture. Testing can be performed either prior to or after packaging. Design verification systems have been developed that selectively excite the inputs of an integrated circuit chip with many input combinations, called test vectors. The outputs of the chip in response to the test vectors are checked for accuracy. For every test vector, there is an expected output, which is defined by the function performed by the electronic circuitry located within the chip. If there is a discrepancy between the expected output and the actual output when the circuit is presented with a specific test vector, there is likely a design error or, later, a manufacturing error in the chip. By testing a large number of input combinations, the likelihood that a design or manufacturing fault in the chip will pass undetected is significantly reduced, if not eliminated.

A typical design verifier used to test prototype chips includes a metallic chassis that holds the electronic circuitry necessary to test a chip, termed the device-under-test (DUT). The circuitry undergoing testing is typically mounted on a printed circuit board that electromechanically positions the integrated circuit device such that the pins of the chip can be connected to the test circuitry in the chassis. This circuit board, generally known as a DUT board, also functions to maintain a controlled impedance signal path from the test electronics to the chip pins. This is normally accomplished by providing paths of near equal length for electrical signal travel. The DUT board is also normally removable, so that removable connecting wires can be easily placed between the chip pins in the center of the board and the input/output (I/O) stimulus connections on the periphery of the board.

To ensure proper operation of a chip under a variety of conditions, tests are performed using a wide range of operating parameters. For example, the chip may be tested for over a wide temperature range. This change in temperature may cause thermal expansion or contraction of the device holding the chip on the tester. Further, operation of the chip itself generates heat, and this heat may also contribute to the thermal expansion of the device.

A typical design verifier holds a large number of chips in close proximity to one another. Because of slight changes in the relative positions of the connections between the DUT board and the test system, signal integrity with the DUT may be lost. Such differences may be caused by thermal expansion and retraction, machining tolerances, physical movement, or other factors. A system is needed that permits some variation between the DUT board and the test system with sacrificing signal integrity.

SUMMARY OF THE INVENTION

The invention enhances the ability of a DUT board to have slight variations from the test system. An assembly on the DUT board permits movement of a compliant contactor while maintaining a high level of signal integrity. The compliant contactor accepts a variety of different sized semiconductor devices along with a variety of different pinouts of the semiconductor devices. The compliant contactor includes an upper alignment block which receives the semiconductor device and a lower alignment block which contacts the contact pins of the tester. The upper alignment block may move within a predefined distance with respect to the lower alignment block to account for any tester movement, thermal expansion or contraction, or other factors. In an alternative embodiment, the compliant contactor may move in three directions with respect to the test board. In this embodiment, a contact pad provides electrical connection between a daughter card and the test board. The contact pad may be a compressible elastomeric connector.

One embodiment of the invention is a semiconductor contactor which holds and aligns semiconductors under test on a test board. The contactor comprises a contact housing having a plurality of contacts and being adapted to receive a semiconductor. An upper alignment block has a first plurality of pin apertures. An adaptor electrically connects the contacts on the contact housing to the pin apertures in the upper alignment block. A lower alignment block having a second plurality of pin apertures is positioned in coordination with the upper alignment block to align the pin apertures of the lower alignment block with the pin apertures of the upper alignment block. The aligned pin apertures receive a respective contact pin. The lower alignment block is fixed to the test board and is movable with respect to the upper alignment block to allow relative movement of the upper alignment block with respect to the lower alignment block. The aligned pin apertures have an enlarged region to permit movement of the contact pin within the aligned pin apertures when the upper alignment block moves with respect to the lower alignment block. The upper alignment block may be movably connected to the lower alignment block by a plurality of bearings. The bearings are positioned within retaining apertures of a set size which limits the movement of the upper alignment block. The upper alignment block may also be movably connected to the lower alignment block by a layer of slidable material. For example, in exemplary embodiments, the slidable material may be Teflon® or Nicotef.

Another embodiment of the invention is a semiconductor contactor which holds semiconductors under test on a test board comprising a daughter card having a first plurality of electrical contacts and a socket adapted to receive a semiconductor. The socket is attached to the daughter card. A resilient contact pad is positioned between the daughter card and the test board to electrically connect the electrical contacts on the daughter card to electrical contacts on the test board. A plurality of floating assemblies movably connect the daughter card to the test board and permit movement of the daughter card within a predefined range in relation to the test board. The resilient contact pad maintains electrical connection between the electrical contacts on the daughter card and the electrical contacts on the test board throughout the predefined range of movement of the daughter card.

Another embodiment of the invention is a method of holding a semiconductor device under test to a test board. The method comprises inserting the semiconductor device into a socket and movably attaching and electrically connecting an upper alignment block to a lower alignment block. The lower alignment block is secured to a test board. The invention further comprises electrically connecting the socket to the upper alignment block. An adaptor may be positioned between the upper alignment block and the socket. If included, the adaptor provides electrical connections between the upper alignment block and the socket.

Another embodiment of the present invention is a method of holding a semiconductor device under test to a test board. The method comprises movably attaching a daughter board to the test board. The daughter board is movable with respect to the test board within a predefined range in three dimensions. A socket is then connected to the daughter board, with the socket being adapted to receive the semiconductor device. A resilient contact pad is positioned between the daughter card and the test board to provide electrical connection from the daughter card to the test board throughout the predefined range of movement of the daughter card.

Another embodiment of the invention is a semiconductor contactor which aligns semiconductors under test on a test board. The semiconductor contactor comprises means for connecting a semiconductor and an upper alignment block having a first plurality of pin apertures. The semiconductor contactor also includes means for electrically connecting the semiconductor to the pin apertures in the upper alignment block. A lower alignment block has a second plurality of pin apertures positioned in coordination with the upper alignment block to align the pin apertures of the lower alignment block with the pin apertures of the upper alignment block to receive a respective contact pin in the upper and lower pin apertures. The lower alignment block is fixedly connected to the test board. Means for movably connecting the upper alignment block to the lower alignment block permit relative movement of the upper alignment block in relation to the lower alignment block. Also included are means for permitting movement of the contact pins within the aligned upper and lower pin apertures over the set degree of movement of the upper alignment block.

Another embodiment of the invention is a semiconductor contactor which holds semiconductors under test on a test board. The semiconductor contactor comprises a daughter card having a first plurality of electrical contacts and a socket adapted to receive a semiconductor. The socket is attached to the daughter card. Also included are means for electrically connecting the electrical contacts on the daughter card to electrical contacts on the test board and means for movably connecting the daughter card to the test board. The daughter card is movable within a predefined range with respect to the test board. Electrical connection is maintained between the electrical contacts on the daughter card and the electrical contacts on the test board throughout the predefined range of movement of the daughter card.

Another embodiment of the invention is an apparatus for connecting a semiconductor to a test board. The apparatus comprises a housing adapted to receive a semiconductor and a first section connected to the housing. A second section is connected to the test board. The first section is movable within a predefined range with respect to the second section. The second section maintains electrical connection between the first section and the test board throughout the predefined range of movement.

BRIEF DESCRIPTION OF THE DRAWINGS

These and other features and advantages of the invention will become more apparent upon reading the following detailed description and upon reference to the accompanying drawings.

DETAILED DESCRIPTION

Figure 1:
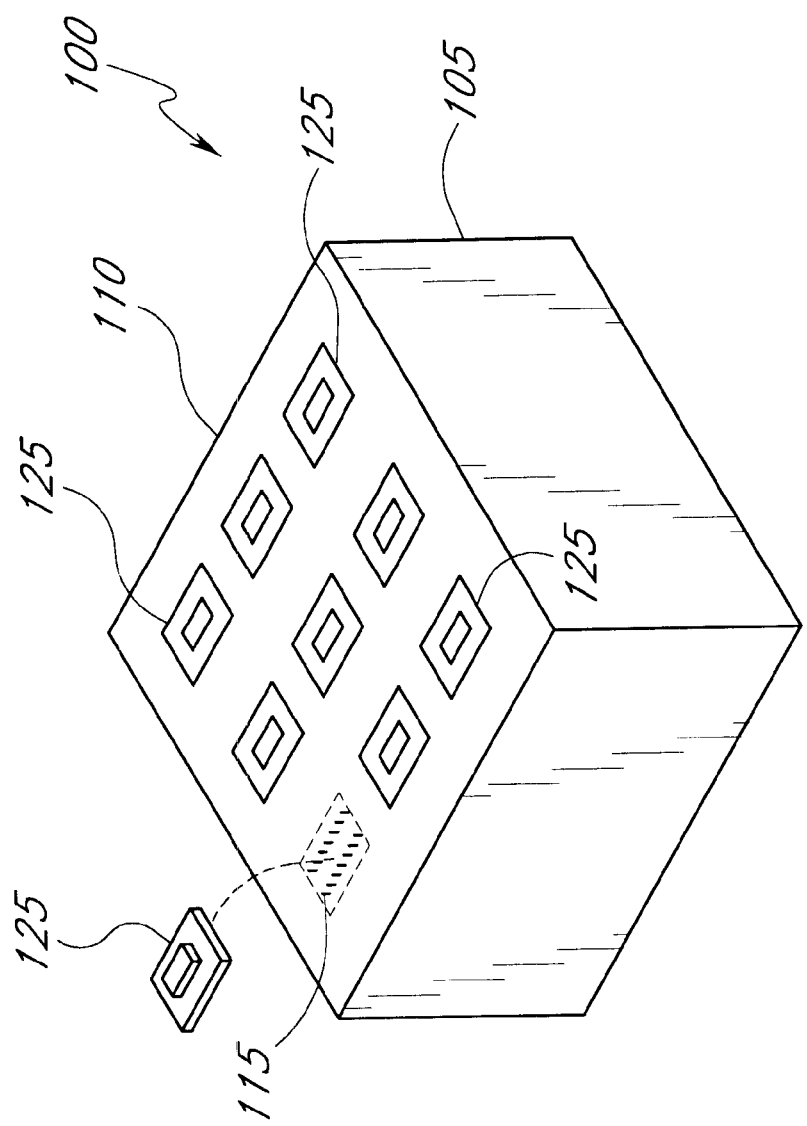
FIG. 1 is a perspective view of a tester which may use a compliant contactor according to the present invention.

FIG. 1 illustrates a tester 100 used to test semiconductor devices. The tester 100 includes a tester chassis 105 which houses the test electronics (not shown). A test plane 110 on the tester chassis 105 provides a location where compliant contactors 125 are used to interface the semiconductor devices under test to the test electronics. In one embodiment, the test plane 110 is designed to receive a plurality of compliant contactors 125, permitting simultaneous testing of multiple semiconductor devices. Alternatively, the tester 100 may be designed to only receive a single compliant contactor 125 at any time.

The compliant contactor 125 interfaces with the tester 100 through a plurality of contact pins 115. The contact pins 115 provide an electrical connection to the test electronics in the tester 100. When the compliant contactor 125 in attached to the tester 100, the compliant contactor 125 provides the electrical connection between the contact pins 115 and the semiconductor device under test.

Figure 2:
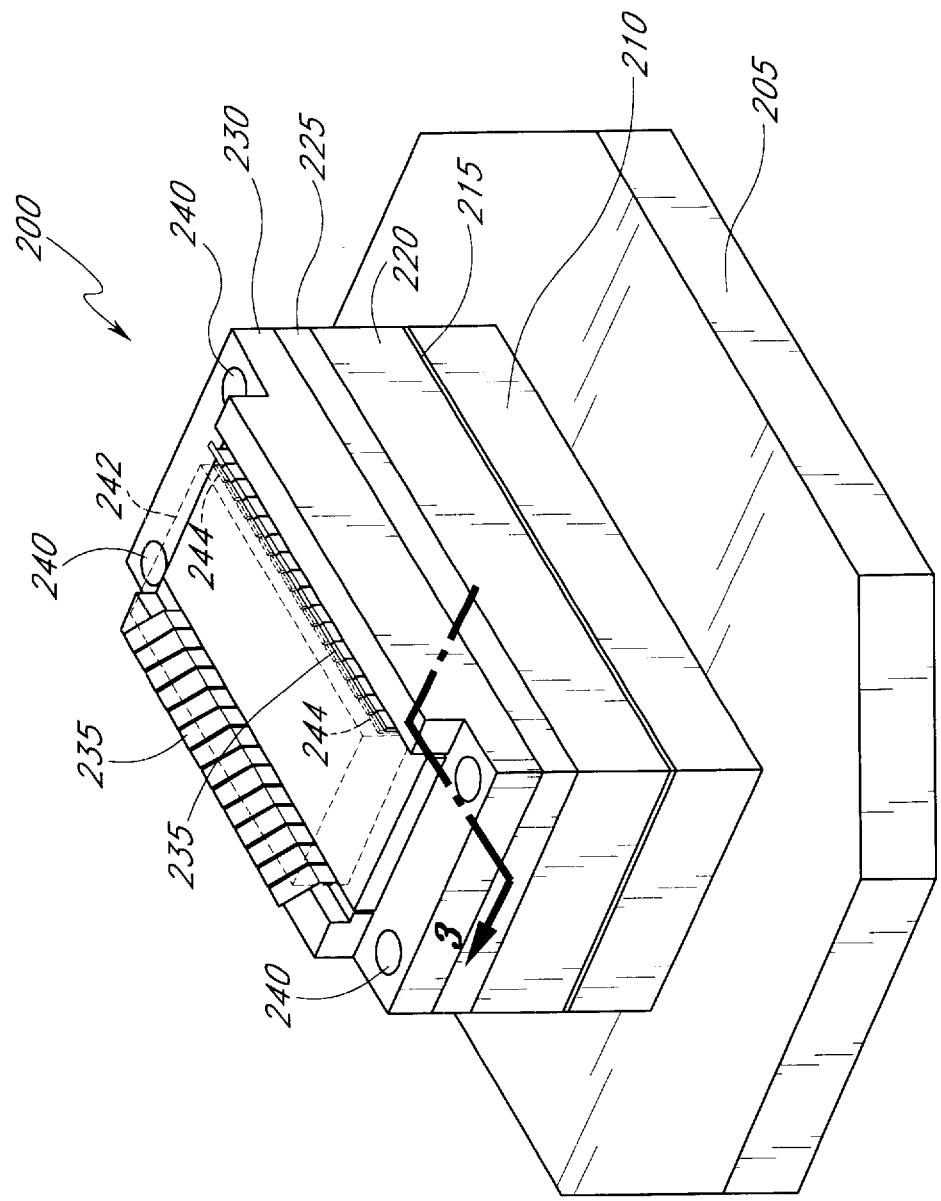
FIG. 2 is a perspective view of one embodiment of a compliant contactor according to the present invention.

FIG. 2 shows a compliant contactor 200 according to one embodiment of the present invention. The compliant contactor 200 contains a lower alignment block 210, an upper alignment block 220, an adaptor 225, and a contactor 230 mounted to a test board 205. The test board 205 is designed to interface with the tester 100 to provide electromechanical connection to the tester 100. The lower alignment block 210 is positioned proximate the test board 205 such that the lower alignment block 210 establishes an electrical connection with the test board 205. When attached, the lower alignment block 210 does not move in relation to the test board 205. The upper alignment block 220 is positioned over the lower alignment block 210 to generally form a single alignment block. However, the upper alignment block 220 is positioned such that a gap 215 is formed between the upper alignment block 220 and the lower alignment block 210. The upper alignment block 220 is also attached in a manner to allow limited movement of the upper alignment block 220 with respect to the lower alignment block 210. Specific types of connections between the upper alignment block 220 and the lower alignment block 210 are presented in detail below. In one embodiment, the compliant contactor 200 measures approximately 3.6 centimeters in width, 1.5 centimeters in height, and 1.6 centimeters in depth.

The adaptor 225 is positioned on the upper alignment block 220 to provide electrical connections between the upper alignment block 220 and the contactor 230. The adaptor 225 may be any component which is capable of providing electrical connections. One example of the adaptor 225 is a printed circuit board. The adaptor 225 permits each contact 235 of the contactor 230 to connect to any individual contact pin contained in the upper alignment block 220. The adaptor 225 provides the flexibility of testing semiconductor devices having variable pinouts. A separate adaptor 225 may be created for each separate semiconductor device 242 (shown in phantom). Alternatively, if a direct connection between the contacts 235 and the upper alignment block 220 is desired, no adaptor 225 would be necessary.

The contactor 230 is positioned over the adaptor 225. The contactor 230 includes the contacts 235 designed to accept the pins 244 of a semiconductor device 242. The contactor 230 holds the semiconductor device 242, also known as the device under test (DUT), and provides the electrical connection between the semiconductor device 242 and the adaptor 225. The number of contacts 235 available on the contactor 230 may vary as needed, and different sizes of contactors 230 may be used for different sized semiconductor devices 242.

A plurality of fasteners 240 secure each of the components of the compliant contactor 200 together. The fasteners 240 extend from the contactor 230, through the adaptor 225, through the upper alignment block 220, through the lower alignment block 210, and through the test board 205. A nut 241 (FIG. 3) is threaded on the end of the fasteners 240 to secure the components of the compliant contactor 200 together. Any type of fastener 240 may be used, including screws, bolts, or other like fasteners.

Figure 3:
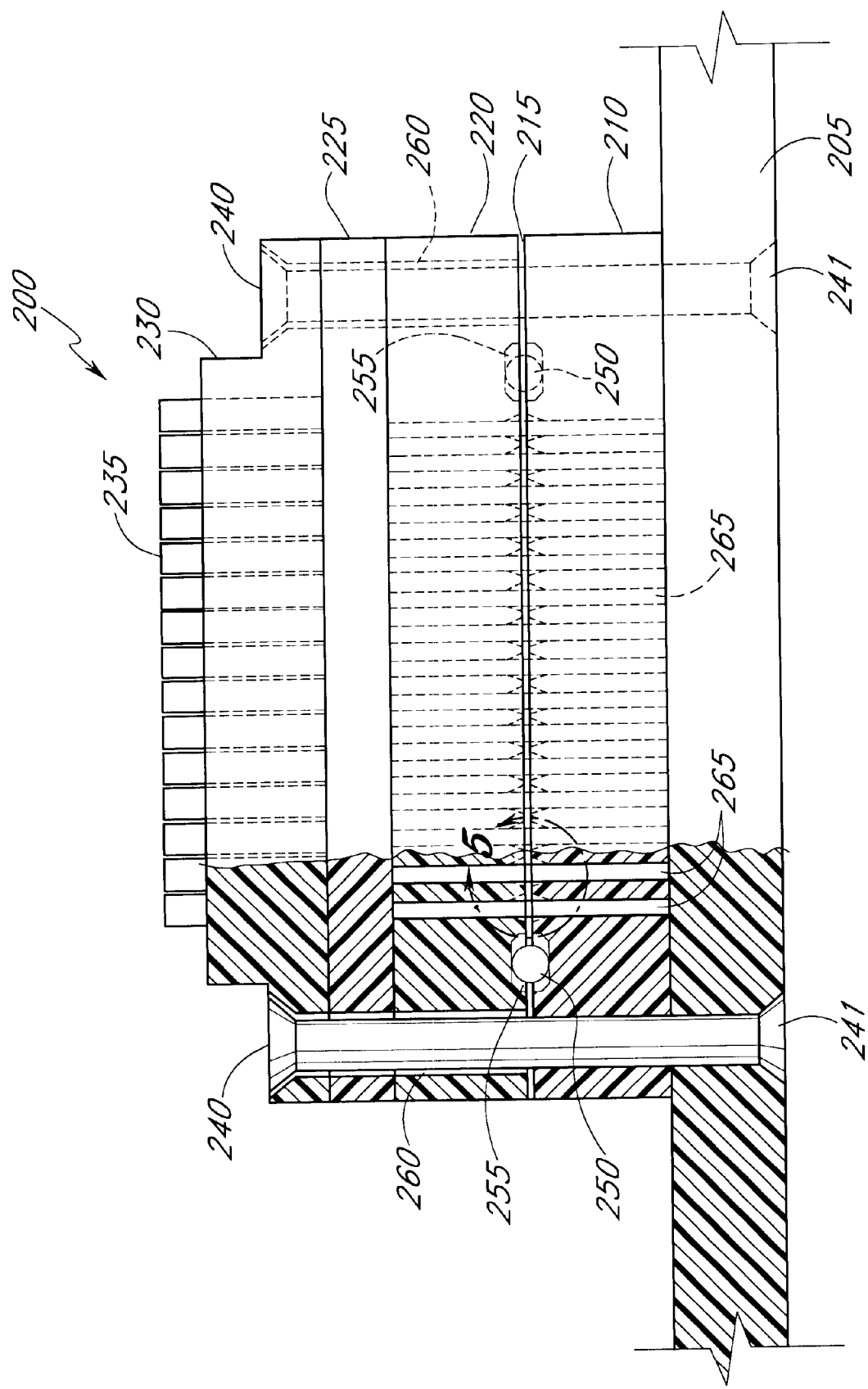
FIG. 3 is a front cross-sectional view of one embodiment of the compliant contactor of FIG. 2.

FIG. 3 shows a cross-sectional view of the compliant contactor 200 of FIG. 2 according to one embodiment of the present invention. In this embodiment, a plurality of bearings 250 are positioned between the upper alignment block 220 and the lower alignment block 210. Due to thermal expansion or retraction, tester 100 movement, or other factors, the upper alignment block 220 may roll on the bearings 250 and move with respect to the lower alignment block 210.

Each bearing 250 is positioned within a retaining aperture 255. The retaining apertures 255 extend from within the lower alignment block 210 to the upper alignment block 220 and are of a size that is slightly wider than the diameter of the bearing 250. The retaining apertures 255 allow the upper alignment block 220 to move within a predefined distance in relation to the lower alignment block 210. When the upper alignment block 220 reaches the limit of the predefined distance, the bearing 250 contacts a wall of the retaining aperture 255, thereby stopping the movement of the upper alignment block 220. The bearings 250 are of sufficient diameter that the upper alignment block 220 is spaced apart from the lower alignment block to form the gap 215 therebetween.

Although the upper alignment block 220 moves with respect to the lower alignment block 210, the fasteners 240 remain stationary. To allow movement of the upper alignment block 220, fastening apertures 260 are included within the upper alignment block 220. The fastening apertures 260 permit the upper alignment block 220 to move around the stationary fastener 240. The fastening apertures 260 are slightly larger than the size of the fastener 240 to permit movement over the predefined distance as determined by the retaining apertures 255. The fastener apertures 260 extend through the upper alignment block 220, the adaptor 225, and the contactor 230. Alternatively, the fastener apertures 260 may extend through the lower alignment block 210 and the test board 205.

FIG. 3 also illustrates a plurality of pin apertures 265 extending through the upper alignment block 220 and the lower alignment block 210. Each pin aperture 265 is designed to receive a contact pin which provides electrical connections from the test board 205 to the adaptor 225. The adaptor 225 in turn provides electrical connection between the upper alignment block and the contact pins 235. Therefore, the entire compliant contactor 200 provides electrical connection between the contacts 235 and the test board 205.

Figure 4:
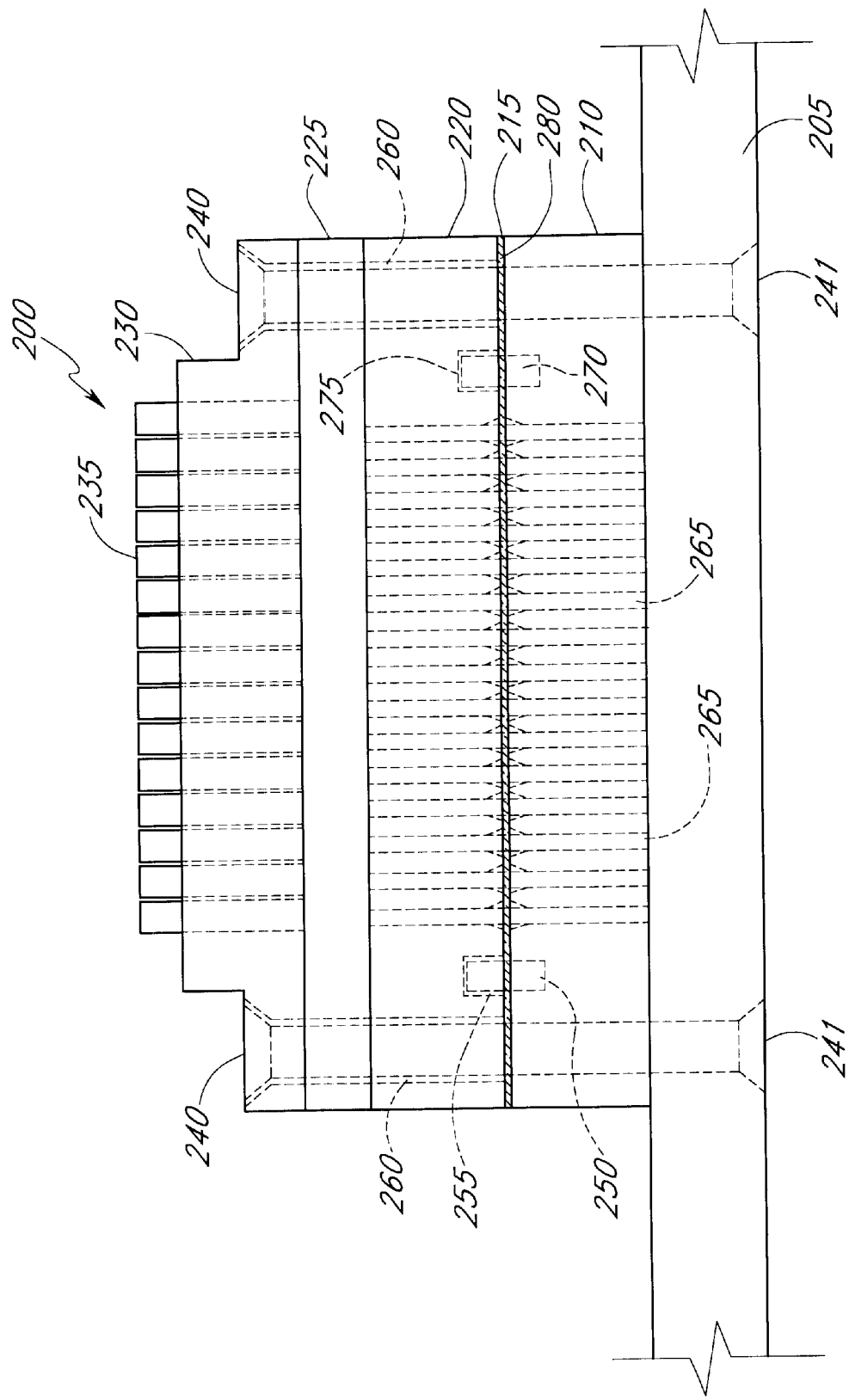
FIG. 4 is a front cross-sectional view of an alternative embodiment of the compliant contactor of FIG. 2.

FIG. 4 illustrates a cross-sectional view of the compliant contactor 200 of FIG. 2 according to an alternative embodiment of the present invention. In FIG. 4, a plurality of dowels 270 extend from the lower alignment block 210 to the upper alignment block 220. The dowels 270 are secured in the lower alignment block 210 and protrude into retaining apertures 275 in the upper alignment block 220. As the upper alignment block 220 moves, the retaining apertures 275 move around the dowels. The dowels 270 are constrained by the side walls of the retaining apertures 275 to limit the movement of the upper alignment block 220 with respect to the lower alignment block 210.

A slidable material 280 is contained within the gap 215. The slidable material 280 may include Teflon®, Nicotef, or other appropriate material. The slidable material 280 can be applied on the top surface of the lower alignment block 210, on the bottom surface of the upper alignment block 220, or on both surfaces. The slidable material 280 permits the upper alignment block 220 to slide smoothly along the top of the lower alignment block 210.

Figure 5:
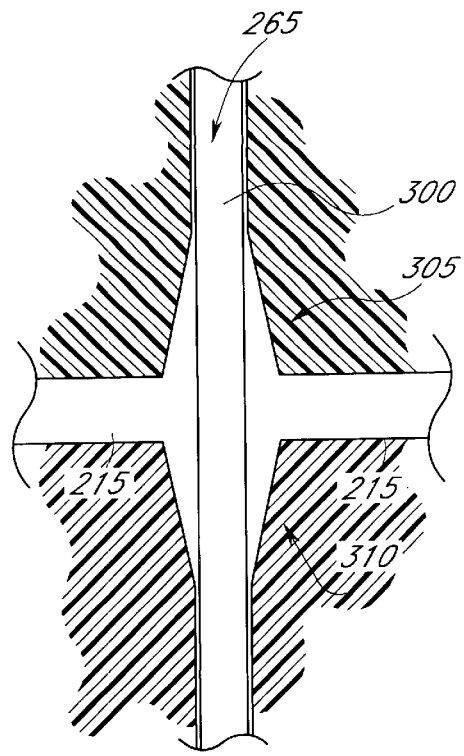
FIG. 5 is a detailed cross-sectional view of a pin aperture and associated pin of the compliant contactor of FIGS. 3 and 4.

FIG. 5 shows a detailed view of a section of a pin aperture 265. A contact pin 300 extends within the pin aperture 265 through the upper alignment block 220 and the lower alignment block 210. The contact pin 300 provides the electrical connection between the adaptor 225 and a test board 205. Each pin aperture 265 is divided into an upper pin aperture 305 contained within the upper alignment block 220 and a lower pin aperture 310 contained within the lower alignment block 210. When the upper alignment block 220 is positioned directly over the lower alignment block 210, and no compression force is applied, the contact pin 300 remains straight within the pin aperture as illustrated in FIG. 5.

Figure 6:
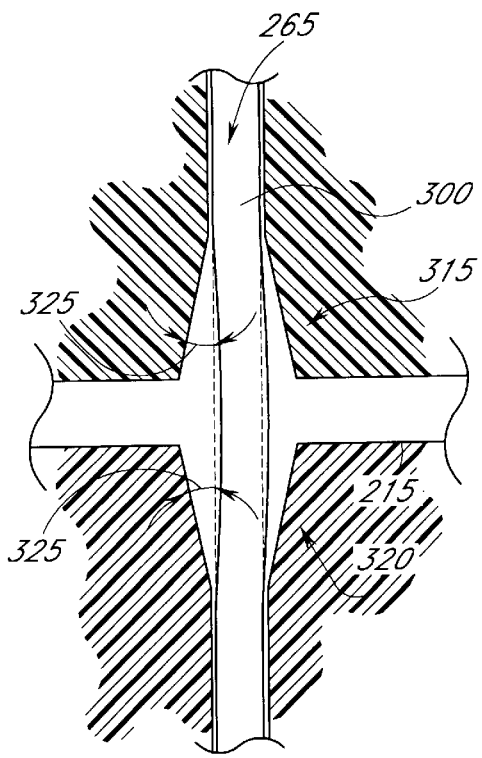
FIG. 6 is a detailed cross-sectional view of a pin aperture of FIG. 5 with the associated pin being compressed.
Figure 7:
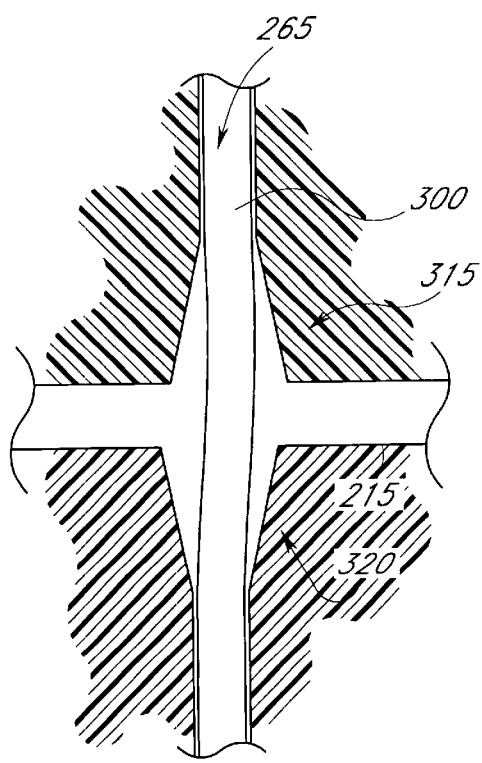
FIG. 7 is a detailed cross-sectional view of a pin aperture of FIG. 5 with the associated pin being skewed.

FIGS. 6 and 7 illustrate features of the pin aperture 265 which permit movement of the upper alignment block 220 with respect to the lower alignment block 210. In FIG. 6, an upper expanded region 315 and a lower expanded region 320 of the pin aperture 225 are shown. The combination of the upper expanded region 315 and the lower expanded region 320 provides an area which permits movement of the contact pin 300 within the pin aperture 265. In one embodiment, the upper expanded region 315 and the lower expanded region 320 are formed using a lead-in angle 325 of 10E.

FIG. 6 illustrates movement of the contact pin 300 due to compression of the upper alignment block 220 with respect to the lower alignment block 210. If a compression force is applied to the compliant contactor 200, the upper alignment block 220 moves toward the lower alignment block 210 thus decreasing the size of the gap 215. In this circumstance, the contact pin 300 bows within the upper expanded regions 315 and the lower expanded region 320. Without the upper and lower expanded regions 315 and 320 allowing for bowing of the contact pin 300, the size of the contact pin 300 would prevent the upper alignment block 220 from being compressed toward the lower alignment block 210.

FIG. 7 illustrates movement of the contact pin 300 due to movement of the upper alignment block 220 in a lateral direction in relation to the lower alignment block 210. As the upper alignment block 220 moves in a lateral direction with respect to the lower alignment block 210, the upper expanded region 315 also moves in a lateral direction with respect to the lower expanded region 320. This lateral movement may be assisted by the layer of slidable material 280 between the upper alignment block 220 and the lower alignment block 210. During such lateral movement, the contact pin 300 bends within the upper expanded region 315 and the lower expanded region 320. Without the upper expanded region 315 or the lower expanded region 320, lateral movement of the upper alignment block 220 would likely be precluded by the combined resistance of the plurality of the contact pins 300.

The amount of movement permitted by the upper alignment block 220 depends on a variety of factors, including the lead-in angle 325, the size of the upper expanded region 315 and the lower expanded region 320, and the compliance of the contact pin 300. During design of the compliant contactor 200, the sizes of the upper expanded region 315 and the lower expanded region 320 is selected to coordinate with the sizes of the retaining apertures 255 or the retaining apertures 275. Therefore, when properly coordinated, the sizes of the retaining apertures 255 or 275 limit the movement of the upper alignment block 220 with respect to the lower limit block 210, and not the sizes of the upper expanded region 315 or the lower expanded region 320.

Figure 8:
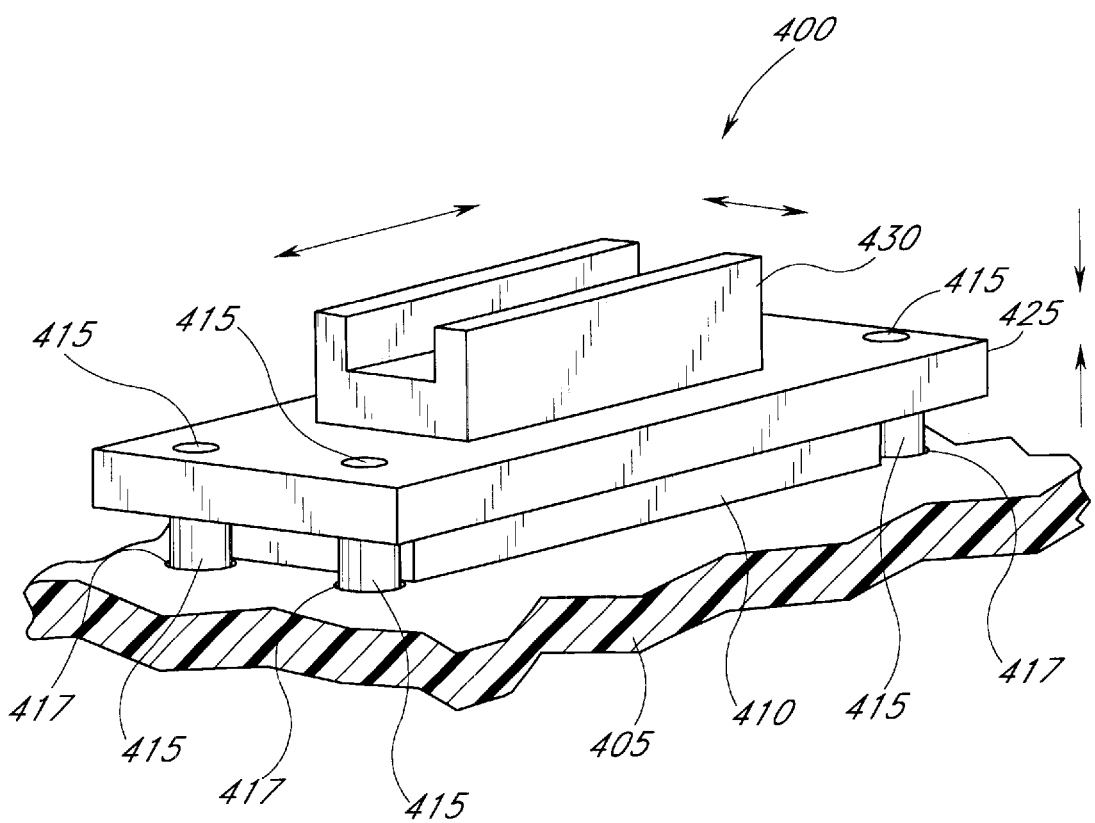
FIG. 8 is a perspective view of an alternative embodiment of a compliant contactor according to the present invention.

FIG. 8 shows an alternative embodiment of a compliant contactor 400 according to the invention. The compliant contactor 400 shown in FIG. 8 permits movement of the device under test in three directions. The compliant contactor 400 comprises a test board 405, a contact pad 410, a plurality of floating assemblies 415, a daughter card 425, and a socket 430. The daughter card 425 is connected to the test board 405 through a plurality of floating assemblies 415. The floating assemblies 415 are fixed to the daughter card 425 and permit movement in any of three directions with respect to the test board 405. The floating assemblies 415 extend through the apertures 417 in the test board 405. The apertures 417 in the test board are larger than the size of the floating assemblies 415, allowing the floating assemblies 415 a limited degree of movement within the apertures 417.

The contact pad 410 is positioned between the daughter card 425 and the test board 405. The contact pad 410 provides electrical connection between contacts on the daughter card 425 and contacts on the test board 405. In one embodiment, the contact pad 410 is an elastomeric connector. One type of elastomeric connector that may be used is the ZEBRA™ elastomeric connector available through Fuji-Poly. As the daughter card 425 moves with respect to the test board 405, the contact pad 410 compresses, expands, and skews with the movement of the daughter card 425. However, the contact pad 410 maintains electrical connection between the daughter card 425 and the test board 405 during all movement of the daughter card 425.

A socket 430 is connected to the daughter card 425. The socket 430 is adapted to receive a semiconductor chip as the device under test. The socket 430 is attached to the daughter card 425 in such a manner to provide electrical connection from the pins of the semiconductor device to the contact pads of the daughter card 425. Of course, an adaptor may be included between the socket 430 and the daughter card 425 to provide for varying connections of the pins of the socket 430 to the contact pads of the daughter card 425.

Figure 9:
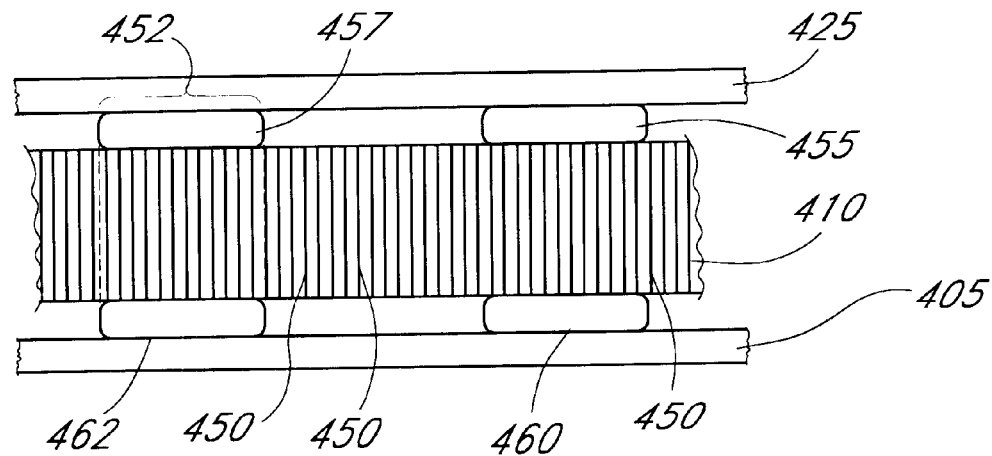
FIG. 9 is a detailed cross-sectional view of a portion of the compliant contactor of FIG. 8 illustrating the electrical connections of the elastomer.

FIG. 9 illustrates the electrical connections between the daughter card 425 and the test board 405 via the contact pad 410. The contact pad 410 includes a plurality of electrical connectors 450 connecting the top surface of the contact pad 410 to the bottom surface of the contact pad 410. Each of the electrical connectors 450 within the contact pad 410 are closely spaced together. The daughter card 425 contains electrical contacts 455 and 457, and the test board 405 contains similar electrical contacts 460 and 462. Each of the electrical contacts 455, 457, 460, and 462 has a surface area of sufficient size to contact a plurality of the electrical connectors 450 in the contact pad 410. When the daughter card 425 is positioned directly over the test board 405, the contact 457 is electrically connected to the contact 462 through a connection group 452 of the electrical connectors 450 of the contact pad 410. The connection group 452 comprises a number of the electrical connectors 450. Each electrical connector 450 provides an electrical connection between the contact pad 457 and the contact pad 462, with the entire connection group 452 providing a complete electrical connection. A similar connection is made between the contact pad 455 and the contact pad 460. Because the contact pad 410 is compressible, compression of the daughter card 425 in a direction towards the test board 405 compresses the contact pad 410. However, the contact pad 410 maintains the connection group 452 between the contact 457 and the contact 462, thereby maintaining electrical connection between the daughter card 425 and the test board 405 during movement of the daughter card in a direction towards the test board 405.

Figure 10:
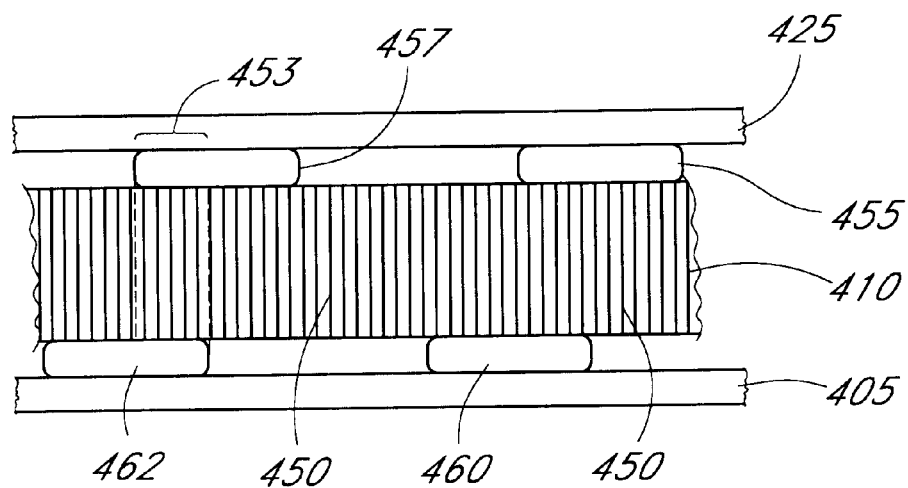
FIG. 10 is a detailed cross-sectional view of a portion of the compliant contactor of FIG. 8 showing the elastomer in a skewed condition.

FIG. 10 illustrates the connection between the daughter card 425 and the test board 405 during a lateral movement of the daughter card 425 with respect to the test board 405. As the daughter card 425 moves laterally with relation to the test board 405, the connector 457 slides on the surface of the contact pad 410. The total number of electrical connectors 450 of the contact pad 410 touching the contact 457 of the daughter card 425 remains constant. However, as the daughter card 425 moves laterally with respect to the test board 405, the connection group 453 connecting the contact 457 to the contact 462 includes fewer electrical connectors 450 than the original connection group 452. Because only a limited number of electrical connectors 450 are required to maintain a positive electrical connection between the contact 457 and the contact 462, the daughter card may slide laterally with respect to the test board while maintaining electrical connection. The amount of lateral movement of the daughter card 425 permitted with respect to the test board 405 is limited by the size of the apertures 417. The size of the apertures 417 is selected to ensure a minimum number of connectors 450 are in the connection group 453 to maintain electrical connection between the daughter card 425 and the test board 405 during maximum movement of the daughter card 425.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A semiconductor contactor which holds semiconductors under test on a test board, the contactor comprising:

daughter card having a first plurality of electrical contacts;

a socket adapted to receive a semiconductor, the socket being attached to the daughter card;

a resilient contact pad positioned between the daughter card and the test board, the resilient contact pad electrically connecting the first plurality of electrical contacts on the daughter card to a second plurality of electrical contacts on the test board; and a plurality of floating assemblies which movably connect the daughter card to the test board and permit movement of the daughter card within a predefined range in relation to the test board, the resilient contact pad maintaining electrical connection between the first plurality of electrical contacts on the daughter card and the second plurality of electrical contacts on the test board throughout the predefined range of movement of the daughter card.

2. The semiconductor contactor of claim 1, wherein the daughter card is movable in any of the x-axis, the y-axis, or the z-axis in relation to the test board.

3. The semiconductor contactor of claim 1, wherein the resilient contact pad has a plurality of electrical conductors for each of the electrical contacts of the daughter card.

4. The semiconductor contactor of claim 1, wherein the resilient contact pad is an elastomeric connector.

5. The semiconductor contactor of claim 1, further comprising an adaptor which electrically connects the socket to the daughter card.

6. A method of holding a semiconductor device under test to a test board, the method comprising:

movably attaching a daughter board to the test board, wherein the daughter board is movable with respect to the test board within a predefined range in three dimensions;

connecting a socket to the daughter board, the socket being adapted to receive the semiconductor device; and positioning a compressible resilient contact pad between the daughter card and the test board, the resilient contact pad providing electrical connection from the daughter card to the test board throughout the predefined range of movement of the daughter card.

7. The method of claim 6, wherein the resilient contact pad is an elastomeric connector.

8. The method of claim 6, wherein the resilient contact pad is compressible.

9. The method of claim 6, further comprising compressing the resilient contact pad by movement of the daughter card toward the test board.

10. A semiconductor contactor which holds semiconductors under test on a test board, the contactor comprising:

a daughter card having a first plurality of electrical contacts;

a socket adapted to receive a semiconductor, the socket being attached to the daughter card;

means for electrically connecting the first plurality of electrical contacts on the daughter card to a second plurality of electrical contacts on the test board;

means for movably connecting the daughter card to the test board, the daughter card being movable within a predefined range with respect to the test board; and means for maintaining electrical connection between the first plurality of electrical contacts on the daughter card and the second plurality of electrical contacts on the test board throughout the predefined range of movement of the daughter card.

11. The semiconductor contactor of claim 10, wherein the means for maintaining electrical connection between the first plurality of electrical contacts on the daughter card and the second plurality of electrical contacts on the test board is an elastomeric connector.

* * * * *